(12) United States Patent
Li

(10) Patent No.: US 7,541,270 B2
(45) Date of Patent: Jun. 2, 2009

(54) METHODS FOR FORMING OPENINGS IN DOPED SILICON DIOXIDE

(75) Inventor: Li Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 480 days.

(21) Appl. No.: 10/218,047

(22) Filed: Aug. 13, 2002

(65) Prior Publication Data

US 2004/0033684 A1 Feb. 19, 2004

(51) Int. Cl.
*H01L 21/44* (2006.01)
(52) U.S. Cl. ................................. 438/597; 438/706
(58) Field of Classification Search ............. 435/638, 435/256; 438/597, 706
See application file for complete search history.

(56) References Cited

U.S. PATENT DOCUMENTS

| | | | |
|---|---|---|---|
| 5,866,485 A | 2/1999 | Kirchhoff et al. | |
| 6,090,304 A | 7/2000 | Zhu et al. | |
| 6,117,767 A * | 9/2000 | Howard | 438/637 |
| 6,117,791 A | 9/2000 | Ko et al. | |
| 6,121,671 A | 9/2000 | Ko et al. | |
| 6,217,786 B1 | 4/2001 | Hills et al. | |
| 6,277,758 B1 | 8/2001 | Ko | |
| 6,287,905 B2 * | 9/2001 | Kim et al. | 438/197 |
| 6,329,292 B1 | 12/2001 | Hung et al. | |
| 6,337,285 B1 * | 1/2002 | Ko | 438/714 |
| 6,346,482 B2 | 2/2002 | Matsumoto et al. | |
| 6,448,140 B1 * | 9/2002 | Liaw | 438/279 |

* cited by examiner

*Primary Examiner*—Jack Chen
(74) *Attorney, Agent, or Firm*—Dinsmore & Shohl LLP

(57) ABSTRACT

Methods of forming openings in doped silicon dioxide layers and of forming self aligned contact holes are provided. The openings are generally etched in a plasma processing chamber. An etchant gas mixture comprising at least one fluorocarbon gas, at least one hydrogen containing gas, and at least one inert gas is used to strike a plasma. The plasma etches the opening in the doped oxide layer, and the etch is relatively highly selective of the doped oxide layer and relatively minimally selective of undoped oxide and silicon nitride layers. It is emphasized that this abstract is provided to comply with the rules requiring an abstract which will allow a searcher or other reader to quickly ascertain the subject matter of the technical disclosure. It is submitted with the understanding that is will not be used to interpret or limit the scope or meaning of the claims.

16 Claims, 4 Drawing Sheets

METHODS FOR FORMING OPENINGS IN DOPED SILICON DIOXIDE

BACKGROUND OF THE INVENTION

The present invention is directed toward methods of forming openings in doped silicon dioxide. The methods may be used to form self-aligned contact holes and gate structures.

As the size of individual semiconductor devices decreases and packing density increases, the use of self-alignment techniques to relax alignment requirements and improve critical dimension control has become common in semiconductor fabrication. One such technique is called a self-aligned contact (SAC) etch, in which a pair of adjacent gates are utilized to align an etched opening in a doped silicon dioxide layers. The etch used to form the contact opening must often be selective of silicon nitride spacers surrounding the gates. However, when the etch is selective of the silicon nitride spacers, it may not be selective of field oxide regions formed to isolate active areas. If the field oxide regions are etched as a result of a slight misalignment of the mask the, overall performance of the semiconductor device may be degraded.

Thus there remains a need in the art for an etch that is relatively highly selective of doped silicon dioxide layers and relatively minimally selective of silicon nitride and undoped silicon dioxide layers.

SUMMARY OF THE INVENTION

The present invention relates to removing doped silicon dioxide from a structure in a process that is selective to undoped silicon dioxide and silicon nitride. More particularly, the present invention is directed to a method of using a plasma formed from at least one fluorocarbon gas, at least one hydrogen containing gas, and at least one inert gas to remove doped silicon dioxide.

Accordingly, it is an object of the present invention to provide a method of etching an opening in doped silicon dioxide. Further, it is an object of the present invention to provide a method of forming a SAC opening in a semiconductor device. Additional objects and advantages of the present invention will become apparent from the subsequent drawings and detailed description of the preferred embodiments

DETAILED DESCRIPTION OF THE PREFERRED EMBODIMENTS

Figure 1A:
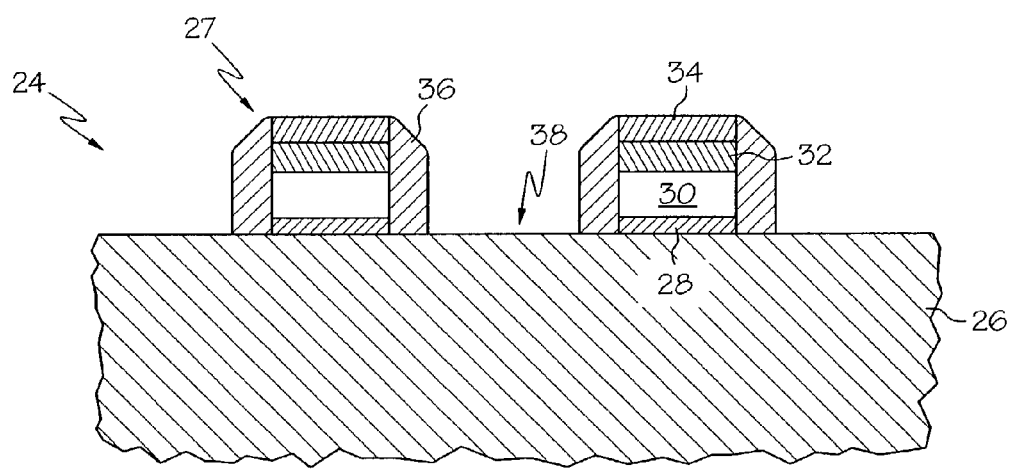
FIGS. 1a-1e illustrate the formation of a gate structure in accordance with the present invention.

The present invention is directed toward methods of forming openings in doped silicon dioxide, and the methods may be used to form self-aligned contact holes. Additionally, gate structures may be formed.

In the following detailed description, reference is made to the accompanying drawings that form a part hereof, and in which is shown by way of illustration, and not by way of limitation, specific embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

FIGS. 1a-1e illustrate the formation of a self-aligned contact hole and the formation of a gate structure for a semiconductor device 24 in a stepwise fashion. Referring to FIG. 1a, a semiconductor substrate 26 is generally provided. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The substrate 26 may be processed in any suitable manner, and the substrate 26 may have structures such as field oxide regions and well regions formed therein.

A pair of gate stacks 27 are formed proximate to the substrate 26 using any suitable process. The gate stacks 27 may be formed from any suitable materials in any suitable configuration. One such configuration includes a gate oxide layer 28 formed proximate to the substrate 26. A polysilicon layer 30 is formed proximate to the gate oxide layer 28, and a conductive layer 32 is formed over the polysilicon layer 30. An insulating layer 34 is formed over the conductive layer 32, and insulating sidewall spacers 36 are formed on either side of the gate stacks 27. The insulating layers 34 and sidewall spacer 36 are generally made of silicon nitride or undoped silicon dioxide. For the purposes of describing and defining the present invention, "undoped silicon dioxide" is defined as including undoped silicon dioxide, undoped silicon dioxide containing impurities that do not act as dopants, tetraethyloxysilicate (TEOS), and field oxide regions. A contact area 38 is defined on the semiconductor substrate 26 between the gate stacks 27.

Figure 1B:
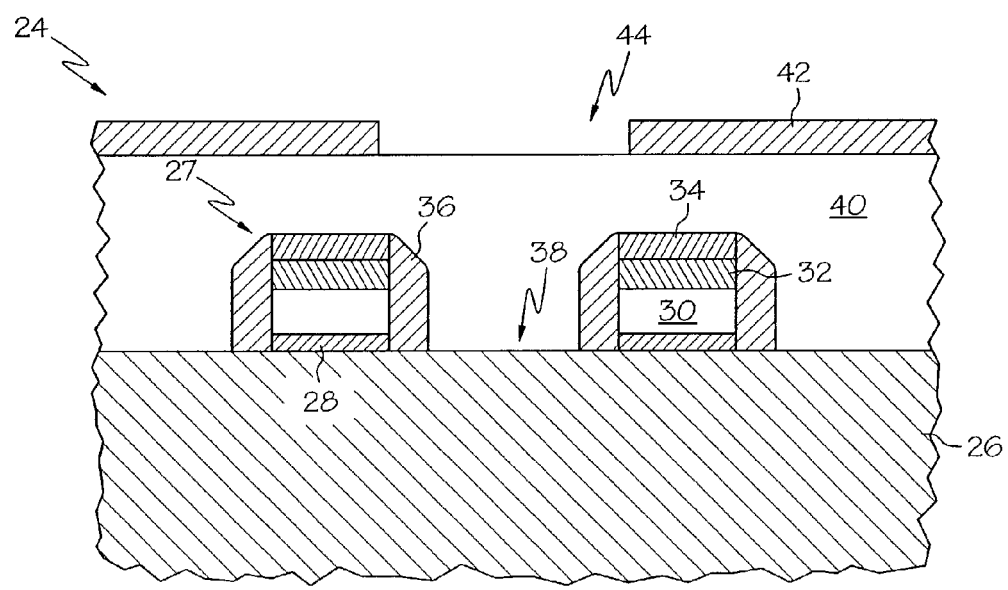

Referring to FIG. 1b, a doped silicon dioxide layer 40 is formed over the pair of gate stacks 27 and proximate to the substrate 26 and the contact area 38. The doped silicon dioxide layer 40 may be formed using any suitable method. The doped silicon dioxide layer 40 is generally borophosphosilicate glass (BPSG) or phosphosilicate glass (PSG) or combinations thereof. A patterned layer 42 is formed on the doped silicon dioxide layer 40. The patterned layer 42 may be formed by depositing a photoresist layer, providing a mask, and developing and subsequently removing appropriate photoresist to form the patterned layer 42. The patterned layer 42 may also be formed in accordance with any suitable method. The pattern layer 42 is formed to leave an area 44 of the doped silicon dioxide layer 40 overlying the contact area 38 exposed.

Figure 1C:
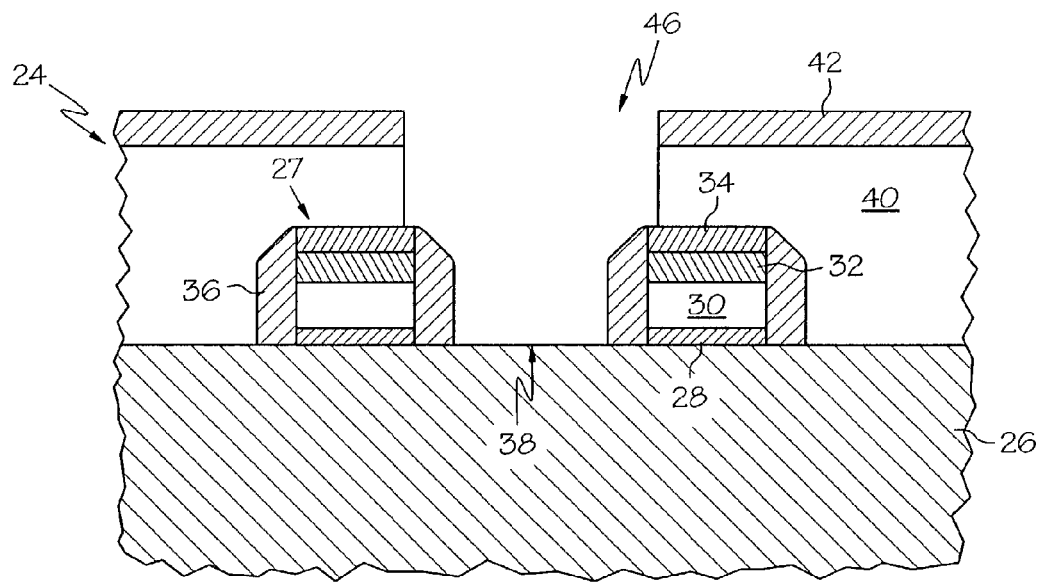
Figure 2:
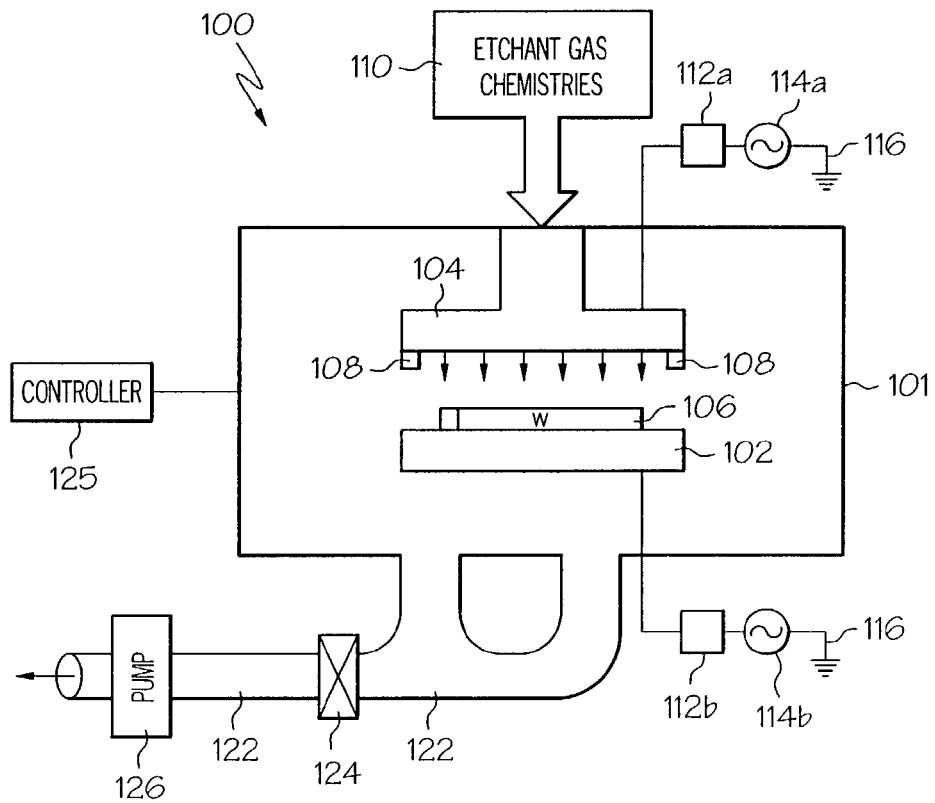
FIG. 2 is a diagram of a plasma processing chamber that may be used in accordance with the present invention.

Referring to FIG. 1c, a self-aligned contact hole 46 is formed in the semiconductor device 24. The self-aligned contact hole 46 is etched so that active area 38 between the pair of gate stacks 27 is exposed. The etch is generally carried out in a plasma processing chamber that is generally programmed to perform in a specified manner. For example, the etch may be carried out in a dual frequency high density plasma processing chamber. However, it is to be understood that the present invention is not limited to methods employing dual frequency plasma processing chambers. FIG. 2 shows one plasma etching system 100 that may be used in accordance with the present invention. The plasma etching system 100 includes a plasma processing chamber 101, and the plasma processing chamber 101 generally includes bottom electrode 102 and a top electrode 104. The top electrode 104 may include a shower head for allowing etchant gas chemistries 110 to enter the processing chamber 101. The top electrode also may include a quartz confinement ring 108 that circles an edge that is under the top electrode 104. A wafer 106 may be placed on the bottom electrode 102.

The process chamber 101 therefore establishes a dual frequency parallel plate processing arrangement where a first radio frequency (RF) source 114a is coupled to the top electrode 104 through a first RF matching network 112a. Similarly, bottom electrode 102 is coupled to a second RF source 114b through a second RF matching network 114b. Each of the RF sources 114a, 114b are coupled to ground 116.

During operation, the process chamber 101 may exhaust etchant gases through a high conductance pumping network 122 that leads to a VAT valve 124. The VAT valve 124 is then coupled to a drag pump 126 that assists in channeling the etchant gases to an appropriate storage unit (not shown). The process chamber 101 is generally controlled by a controller 125 that may be programmed to control the chamber 101 in a desired manner. An Exelan 2300 Series Etcher™ from LAM Research Corporation is one example of a suitable dual frequency processing system.

Referring to FIGS. 1c and 2, the etch that forms the self-aligned contact hole 46 generally uses an etchant gas mixture of at least one fluorocarbon gas, at least one hydrogen containing gas, and at least one inert gas. The fluorocarbon gas generally has a carbon to fluorine ration of greater than or equal to about 0.5. Examples of suitable fluorocarbon gases include, but are not limited to, $CH_3F$, $C_4F_8$, $C_4F_6$, and $CH_2F_2$, and combinations thereof. For purposes of describing and defining the present invention, "hydrogen containing gas" is defined to mean any gas having a hydrogen species except for gases containing a fluorine species. Examples of suitable hydrogen containing gases include, but are not limited to, $H_2$, $NH_3$, and $CH_4$, and combinations thereof. Examples of suitable inert gases include, but are not limited to Ar, He, and Ne, and combinations thereof. For example, the etchant gas mixture may comprise $C_4F_8$, $NH_3$, and Ar. Alternatively, the etchant gas mixture may comprise $C_4F_6$, $H_2$, and Ar.

The etchant gases are generally flowed into a plasma processing chamber and a plasma is struck in the plasma processing chamber from the etchant gases. For example, the etchant gases may be flowed through the showerhead of upper electrode 104 in processing chamber 101. The semiconductor device 24 is then exposed to the plasma and the undoped oxide 40 is etched away in the area 44 exposed by the pattern 42 to form self-aligned contact opening 46. The etchant gases etch the doped oxide layer 40, but they generally etch undoped oxide or silicon nitride regions such as the insulating layers 34 and the sidewall spacers 36 much more slowly. Therefore, the etch is relatively highly selective of doped silicon dioxide and relatively minimally selective of undoped oxide and silicon nitride. Additionally, the etchant gases etch the substrate 26 or other surrounding regions that are comprised of material other than doped oxide much more slowly. Therefore, the insulating layers 34 and sidewall spacers 36 of the gate stacks 27 protect conductive layers from being substantially etched, and the self-aligned contact opening 46 is easily formed without substantially etching into the gate stacks.

If the etch is performed using a dual frequency plasma processing system such as the system illustrated in FIG. 2, the fluorocarbon gas will generally be flowed into the processing chamber at a rate of between about 5 to about 50 standard cubic centimeters per minute (sccm). The hydrogen containing gas will generally be flowed into the processing chamber at a rate of about 1 to about 50 sccm. The inert gas will generally be flowed into the chamber at a rate of about 10 to about 1000 sccm, and the inert gas will more generally have a flow rate of about 100 to about 300 sccm. The processing chamber may be maintained at a pressure of about 1 to about 200 milliTorr, and the processing chamber will more generally be maintained at a pressure of about 50 to about 100 milliTorr. Generally, a power of about 10-2000 Watts may be applied to the processing chamber.

The etch of the present invention provides a wide process window for the fluorocarbon and hydrogen containing gases. Therefore, the gas flow rates of the fluorocarbon and hydrogen containing gases may fluctuate without adversely affecting the etch of the present invention or causing the etch to stop. Generally, the gas flow rates may fluctuate as much as +/−2 sccm for a given etch.

Figure 1D:
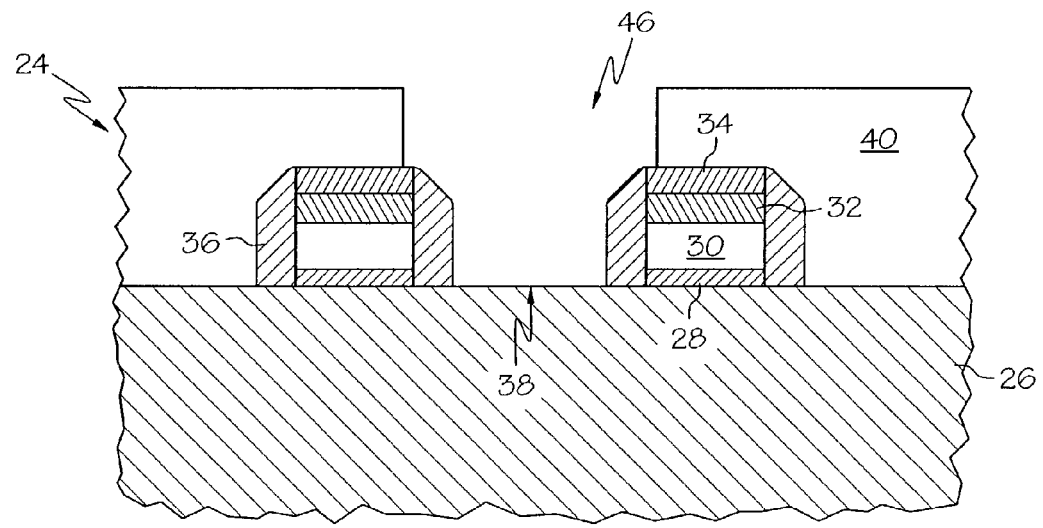
Figure 1E:
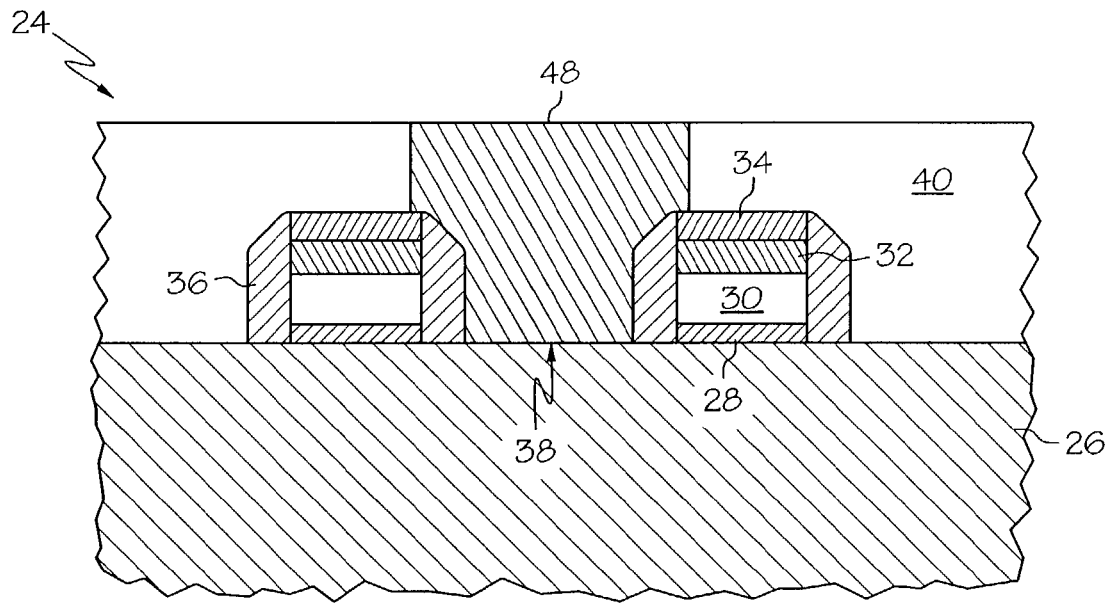

Referring to FIGS. 1d-1e, the self-aligned contact hole may be filled with a contact plug to form a gate structure. The pattern 42 is removed as shown in FIG. 1d. The pattern may be removed by any suitable method. Next, a contact plug 48 formed from conductive material is deposited in contact hole 46. The contact plug 48 contacts active area 38 and allows the active area 38 to be connected to overlying structures (not shown.) The contact plug may be formed and processed according to any suitable method.

Figure 3A:
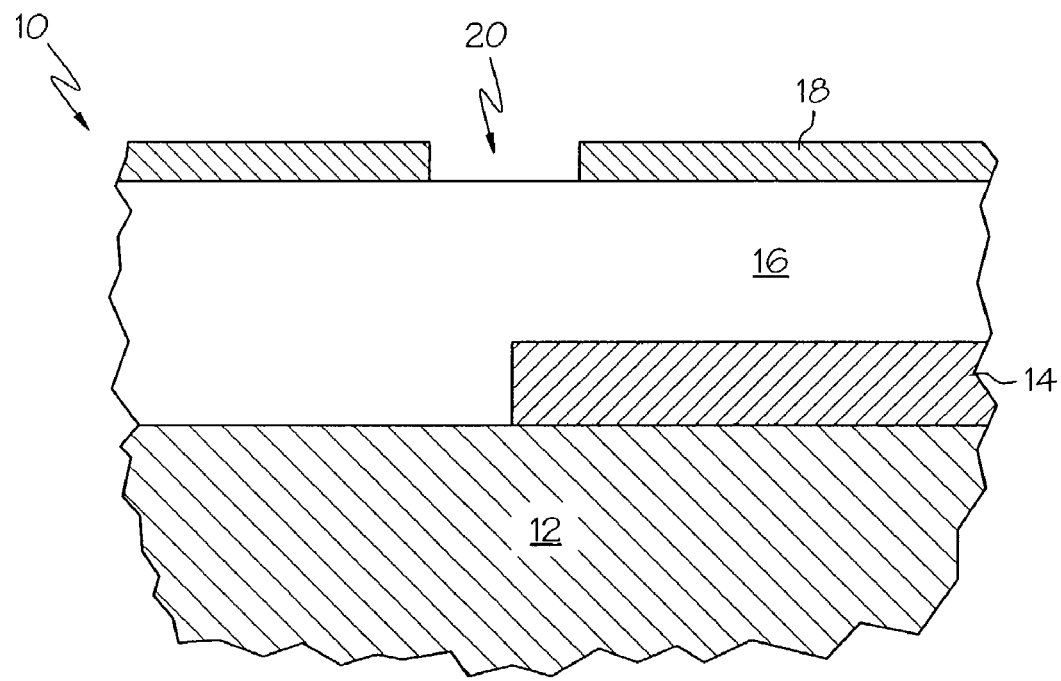
FIGS. 3a-3b illustrate the formation of an opening in a doped silicon dioxide layer in accordance with the present invention.
Figure 3B:
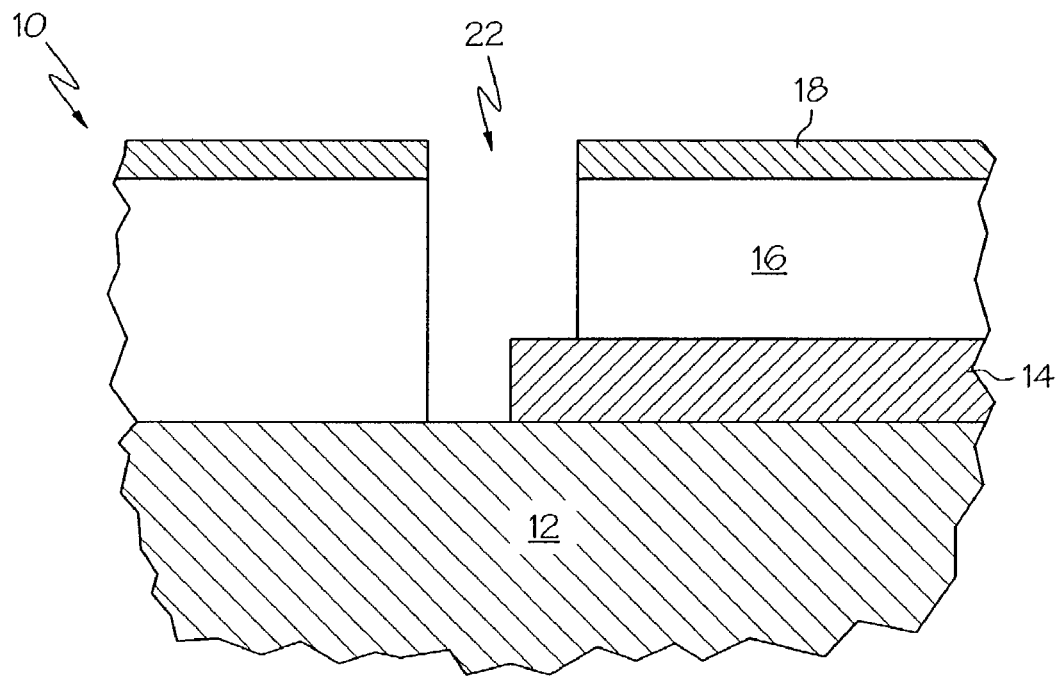

The methods of the present invention may also be used to form an opening in a doped oxide layer of a semiconductor device 10 as shown in FIGS. 3a-3b. Referring to FIG. 3a, a semiconductor substrate 12 is provided, and an undoped silicon dioxide or silicon nitride layer 14 is formed proximate to at least a portion of substrate 12. A doped silicon dioxide layer 16 is formed overlying at least a portion of the layer 14. The doped oxide layer is generally selected from BPSG and PSG and combinations thereof. A pattern 18 is formed over the doped silicon dioxide layer 16 by masking, and the pattern 18 exposes as etch area 20 of the doped silicon dioxide layer 16.

Referring to FIG. 3b, an opening 22 is formed in the silicon dioxide layer 16 at the etching area 20 by etching the silicon dioxide layer. The etch is generally performed in accordance with the methods described above. The etch is relatively highly selective of doped silicon dioxide and relatively minimally selective of undoped silicon dioxide and silicon nitride. Therefore, the layer 14 acts as an etch stop. The etch may contact the substrate 12, or the etch may be performed using undoped silicon dioxide or silicon nitride layers as etch stops to form a desired opening in a doped silicon dioxide layer.

It will be obvious to those skilled in the art that various changes may be made without departing from the scope of the invention, which is not to be considered limited to what is described in the specification. It shall be observed that the present invention can be practiced in conjunction with a variety of integrated circuit fabrication techniques, including those techniques currently used in the art and any other suitable, yet to be developed techniques.

What is claimed is:

1. A method of forming a self-aligned contact hole, comprising:
   providing a pair of gate stacks in spaced relation to one another on a semiconductor substrate, wherein:
      each of said gate stacks has at least one conductive layer formed therein and an insulating layer extending over said conductive layer;
      said insulating layer is selected from undoped silicon dioxide and silicon nitride and combinations thereof; and
      a contact area is defined on said semiconductor substrate between said pair of gate stacks;

forming a spacer composed of a spacer material adjacent to each side of said gate stacks, wherein said spacer material is selected from undoped silicon dioxide and silicon nitride and combinations thereof;

forming a doped silicon dioxide layer over said pair of gate stacks and over said contact area;

forming a patterned layer on said doped silicon dioxide layer, wherein said patterned layer exposes the doped silicon dioxide overlying said contact area; and etching a self-aligned contact hole through doped silicon dioxide exposed by said patterned layer in a plasma processing chamber, wherein said step of etching a contact hole comprises;

flowing an etchant gas mixture consisting essentially of at least one fluorocarbon gas, at least one hydrogen containing gas, said hydrogen containing gas excluding any gas containing a fluorine species, and at least one inert gas into said plasma processing chamber;

striking a plasma in said plasma processing chamber from said etchant gas mixture; and utilizing said plasma to etch said contact hole in said doped silicon dioxide layer, said etch being relatively highly selective of said doped silicon dioxide layer and relatively minimally selective of said insulating layer and said spacer material, and said self-aligned contact hole extending to said contact area.

2. The method as claimed in claim 1 wherein said doped silicon dioxide layer is selected from BPSG and PSG and combinations thereof.

3. The method as claimed in claim 1 wherein said plasma processing chamber comprises a dual frequency plasma processing chamber.

4. The method as claimed in claim 3 wherein said fluorocarbon gas is flowed into said plasma processing chamber at a rate of between about 5 to about 50 sccm.

5. The method as claimed in claim 3 wherein said hydrogen containing gas is flowed into said plasma processing chamber at a rate of between about 1 to about 50 sccm.

6. The method as claimed in claim 3 wherein said fluorocarbon gas is flowed into said plasma processing chamber at a rate of between about 5 to about 50 sccm, and wherein said hydrogen containing gas is flowed into said plasma processing chamber at a rate of between about 1 to about 50 sccm.

7. The method as claimed in claim 3 wherein said plasma processing chamber is at a pressure of about 1 milliTorr to about 200 milliTorr.

8. The method as claimed in claim 1 wherein said inert gas comprises argon.

9. A method of forming a gate structure, comprising:
providing a pair of gate stacks in spaced relation to one another on a semiconductor substrate, wherein:
each of said gate stacks has at least one conductive layer formed therein and an insulating layer extending over said conductive layer;
said insulating layer is selected from undoped silicon dioxide and silicon nitride and combinations thereof; and a contact area is defined on said semiconductor substrate between said pair of gate stacks;

forming a spacer composed of a spacer material adjacent to each side of said gate stacks, wherein said spacer material is selected from undoped silicon dioxide and silicon nitride and combinations thereof;

forming a doped silicon dioxide layer over said pair of gate stacks and over said contact area;

forming a patterned layer on said doped silicon layer, wherein said patterned layer exposes the doped silicon dioxide overlying said contact area;

etching a self-aligned contact hole through doped silicon dioxide exposed by said patterned layer in a plasma processing chamber, wherein said step of etching a contact hole comprises;

flowing an etchant gas mixture consisting essentially of at least one fluorocarbon gas, at least one hydrogen containing gas, said hydrogen containing gas excluding any gas containing a fluorine species, and at least one inert gas into said plasma processing chamber;

striking a plasma in said plasma processing chamber from said etchant gas mixture; and utilizing said plasma to etch said contact hole in said doped silicon dioxide layer, said etch being relatively highly selective of said doped silicon dioxide layer and relatively minimally selective of said insulating layer and said spacers material, and said self-aligned contact hole extending to said contact area;

removing said pattern layer; and forming a contact plug substantially composed of a conductive material in said self-aligned contact hole and in contact with said contact area.

10. The method as claimed in claim 9 wherein said doped silicon dioxide layer is selected from BPSG and PSG and combinations thereof.

11. The method as claimed in claim 9 wherein said plasma processing chamber comprises a dual frequency plasma processing chamber.

12. The method as claimed in claim 11 wherein said fluorocarbon gas is flowed into said plasma processing chamber at a rate of between about 5 to about 50 sccm.

13. The method as claimed in claim 11 wherein said hydrogen containing gas is flowed into said plasma processing chamber at a rate of between about 1 to about 50 sccm.

14. The method as claimed in claim 11 wherein said fluorocarbon gas is flowed into said plasma processing chamber at a rate of between about 5 to about 50 sccm, and wherein said hydrogen containing gas is flowed into said plasma processing chamber at a rate of between about 1 to about 50 sccm.

15. The method as claimed in claim 11 wherein said plasma processing chamber is at a pressure of about 1 milliTorr to about 200 milliTorr.

16. The method as claimed in claim 9 wherein said inert gas comprises argon.

* * * * *

UNITED STATES PATENT AND TRADEMARK OFFICE
CERTIFICATE OF CORRECTION

PATENT NO. : 7,541,270 B2  Page 1 of 1
APPLICATION NO. : 10/218047
DATED : June 2, 2009
INVENTOR(S) : Li Li It is certified that error appears in the above-identified patent and that said Letters Patent is hereby corrected as shown below:

In column 6, line 9, in Claim 9, after "silicon" insert -- dioxide --.

In column 6, line 27, in Claim 9, delete "spacers" and insert -- spacer --, therefor.

In column 6, line 29, in Claim 9, delete "pattern" and insert -- patterned --, therefor.

Signed and Sealed this

Twenty-eighth Day of July, 2009

JOHN DOLL
*Acting Director of the United States Patent and Trademark Office*